US008136005B1

(12) United States Patent
Nazari et al.

(10) Patent No.: US 8,136,005 B1
(45) Date of Patent: *Mar. 13, 2012

(54) MULTI-MODE ITERATIVE DETECTOR

(75) Inventors: Nersi Nazari, Cupertino, CA (US); Zining Wu, Los Altos, CA (US); Greg A Burd, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 1190 days.

This patent is subject to a terminal disclaimer.

(21) Appl. No.: 11/973,500

(22) Filed: Oct. 9, 2007

Related U.S. Application Data

(63) Continuation of application No. 10/927,325, filed on Aug. 27, 2004, now Pat. No. 7,340,003, which is a continuation of application No. 09/559,186, filed on Apr. 27, 2000, now Pat. No. 6,888,897.

(51) Int. Cl.
*H03M 13/00* (2006.01)
*H03M 13/03* (2006.01)
(52) U.S. Cl. ......... 714/752; 714/755; 714/786; 714/795
(58) Field of Classification Search .................. 714/755, 714/786, 780, 794, 795, 752, 758
See application file for complete search history.

(56) References Cited

U.S. PATENT DOCUMENTS

| 4,295,218 A | 10/1981 | Tanner |
| 4,601,044 A | 7/1986 | Kvomer, III et al. |
| 5,537,444 A | 7/1996 | Nill et al. |
| 5,757,821 A | 5/1998 | Jamal et al. |
| 5,926,232 A | 7/1999 | Mangold et al. |
| 5,930,272 A | 7/1999 | Thesling |
| 5,933,462 A | 8/1999 | Viterbi et al. |
| 5,949,831 A | 9/1999 | Coker et al. |
| 5,974,540 A | 10/1999 | Morikawa et al. |
| 5,983,385 A | 11/1999 | Khayrallah et al. |
| 6,002,716 A | 12/1999 | Meyer et al. |
| 6,009,549 A | 12/1999 | Bliss et al. |
| 6,021,518 A | 2/2000 | Pelz |
| 6,023,783 A | 2/2000 | Divasalar et al. |
| 6,028,728 A | 2/2000 | Reed |

(Continued)

FOREIGN PATENT DOCUMENTS

JP 2004164767 10/2004

(Continued)

OTHER PUBLICATIONS

U.S. Appl. No. 09/730,597, filed Dec. 7, 2000, Burd, et al.

(Continued)

*Primary Examiner* — Cynthia Britt
*Assistant Examiner* — Daniel McMahon

(57) ABSTRACT

A storage system comprises a linear block encoder. A write circuit writes an output of the linear block encoder to a storage medium. A read circuit reads data from the storage medium. A channel decoder decodes the data. A soft linear block code decoder that decodes the data decoded by the channel decoder. The channel decoder decodes the data read in a first iteration. In a subsequent iteration the channel decoder decodes the data read by the read circuit and utilizes information decoded by the soft linear block code decoder. A threshold check circuit selects an output of the soft linear block code decoder if a number of parity check violations has a first relationship with respect to a threshold, or an output of the channel decoder if the number of parity check violations has a second relationship with respect to the threshold.

17 Claims, 10 Drawing Sheets

U.S. PATENT DOCUMENTS

| | | | |
|---|---|---|---|
| 6,081,918 | A | 6/2000 | Spielman |
| 6,145,114 | A | 11/2000 | Crozier et al. |
| 6,161,209 | A | 12/2000 | Moher |
| 6,182,261 | B1 | 1/2001 | Haller et al. |
| 6,219,817 | B1 | 4/2001 | Holman |
| 6,405,342 | B1 | 6/2002 | Lee ............................ 714/792 |
| 6,427,220 | B1 | 7/2002 | Vityaev |
| 6,438,180 | B1 | 8/2002 | Kavcic et al. |
| 6,539,367 | B1 | 3/2003 | Blanksby et al. |
| 6,581,181 | B1 | 6/2003 | Sonu |
| 6,615,385 | B1 * | 9/2003 | Kim et al. ................... 714/758 |
| 6,634,007 | B1 | 10/2003 | Koetter et al. |
| 6,662,337 | B1 * | 12/2003 | Brink ........................... 714/792 |
| 6,691,263 | B2 | 2/2004 | Vasic et al. |
| 6,708,308 | B2 | 3/2004 | De Souza et al. |
| 6,715,121 | B1 | 3/2004 | Laurent |
| 7,027,537 | B1 * | 4/2006 | Cheong et al. ............... 375/348 |

FOREIGN PATENT DOCUMENTS

| | | |
|---|---|---|
| WO | WO 96/37050 | 11/1996 |
| WO | WO 00/19616 A2 | 4/2000 |

OTHER PUBLICATIONS

U.S. Appl. No. 09/730,752, filed Dec. 7, 2000, Burd, et al.
U.S. Appl. No. 09/730,603, filed Dec. 7, 2000, Wu, et al.
U.S. Appl. No. 09/730,598, filed Dec. 7, 2000, Wu, et al.
U.S. Appl. No. 09/901,507, filed Jul. 9, 2001, Wu, et al.
Viterbi, Andrew J., "An Intuitive Justification and a Simplified Implementation of the MAP Decoder for Convolutional Codes," IEEE Journal on Selected Areas in Communications, vol. 16, No. 2, Feb. 1995.
MacKay, David J.C., "Good Error-Correcting Codes Based On Very Sparse Matrices," IEEE Transactions on Information Theory, vol. 45, No. 2, Mar. 1999.
Gallager, Robert G., "Low-Density Parity-Check Codes," M.I.T. Press, 1963.
Wu, Zining, "Coding and Iterative Detection for Magnetic Recording Channels," The Kluwer International Series in Engineering and Computer Science, Kluwer Academic Publishers, 2000.
Shoemake and Heegard, Computationally Efficient Turbo Decoding with Bi-directional Viterbi Algorithm (BIVA), IEEE, ISIT 1997.
Wu, Zining, "Coding, Iterative Detection and Timing Recovery for Magnetic Recording Channels, A Dissertation".
L.H.C. Lee, Computation of the Right-Inverse of G(D) and the Left-Inverse of H'(D), Jun. 21, 1990, I.E.E.E. vol. 26, No. 13, pp. 904-906.
J. Hagenauer and P. Hoeher: "A Viterbi algorithm with soft-decision outputs and its applications," Proc. IEEE GLOBECOM '90, Dallas, Tex., pp. 47.1.1-47.1.7, Nov. 1989.
Öberg, Mats, "Parity Check Codes for Partial Response Channels," IEEE Global Telecommunications Conference—Globalcom '99, pp. 717-722, 1999.

* cited by examiner

MULTI-MODE ITERATIVE DETECTOR

CROSS-REFERENCE TO RELATED APPLICATIONS

This application is a continuation of U.S. patent application Ser. No. 10/927,325 filed on Aug. 27, 2004, which application is a continuation of U.S. application Ser. No. 09/559,186, filed Apr. 27, 2000. The disclosures of the above applications are incorporated herein by reference.

BACKGROUND

1. Field of the Invention

This invention relates generally to an iterative decoder. More particularly, the present invention relates to an iterative decoder for application in either digital data transmission or digital data storage and a method embodied therein.

2. Background Information

FIG. 1 illustrates a conventional digital data transmission system. As shown therein a digital data transmission system comprises a transmitting section 300 for transmitting data to receiver 500 via communication channel 401. During the transmission operation shown in FIG. 2, the data is first encoded in a conventional manner by run length limited (RLL) encoder 302 or RLL encoder means, and parity bits are encoded by linear block code encoder 304 or linear block encoder means. The combined RLL encoded data and parity bits are then input to transmitter 306 or transmitting means for transmission as an analog, electrical signal over communication channel 401. Communication channel 401 may include any wireless, wire, optical and the like communication medium. Receiver 500 comprises an analog to digital converter 502 or analog to digital converting means to converts the data transmitted on communication channel 401 to a digital signal. The digital signal is input to soft channel decoder 504, which provides probability information of the detected data. Soft linear block code decoder 506 utilizes this information and the parity bits. Soft channel decoder 504 and soft linear block code decoder 506 operate in an iterative manner to decode the detected data.

Linear block codes are well known to those of ordinary skill in the art. One example of a linear block code is a low density parity check code (LDPC) which is discussed by Robert G. Gallager in *Low-Density Parity-Check Codes*, 1963, M.I.T. Press and by Zining Wu in *Coding and Iterative Detection For Magnetic Recording Channels*, 2000, Kluwer Academic Publishers, the contents of each of which are incorporated in their entirety by reference.

FIGS. 2a-2c show a digital data storage system. As illustrated in FIG. 2a, hard disk drive 100 comprises a magnetic disk and head assembly 104 including a stack of several rigid magnetic disks 102 and several magnetic transducers positioned on a movable arm 105 for operable interaction with the magnetic recording surfaces on each disk. These magnetic heads slide or 'fly' in close proximity over the surfaces of the magnetic disks 102 to react to the changes in orientations of magnetic fields of tiny magnetic domains on the disks that represent the stored data. These interactions with magnetic fields produce electrical signals of constantly varying amplitudes that are pre-amplified to produce resulting analog waveforms 106, as shown in FIG. 2b, that are applied to a read-channel integrated circuit 109, as shown in FIG. 2c. The read channel integrated circuit 108 processes the waveform and produces data-representing signals having digital waveforms 110, as shown in FIG. 2d. The same integrated circuit 108 is also used during data-writing processes to transform user data in digital form to analog waveforms that are then recorded on a disk 102 via the associated magnetic transducer.

FIG. 3 illustrates typical flow of data signals during write operations by encoder 600 onto disk drive 400 and read operations by read channel 700 from disk drive 400. During the write operation shown in FIG. 3, the data is first encoded, similarly to the digital data transmission system described above, by run length limited (RLL) encoder 302, and parity bits are encoded by linear block code encoder 304. The combined RLL encoded data and parity bits are then input to current generator 402 or writing means for generating a current to drive write head 404. Write head 404 magnetizes disk 406 for storing the data signal thereon.

In the reading process, read head 408 detects and converts the data stored on disk 406 to an analog, electrical signal. The electrical signal is converted to a digital signal in read channel 700 by analog to digital converter 502. The digital signal is input to soft channel decoder 504. Soft linear block code decoder 506 utilizes this information and the parity bits. Soft channel decoder 504 and soft linear block code decoder 506 operate in an iterative manner to decode the detected data.

One disadvantage of the conventional iterative decoding approach is that, even though this approach produces robust gains in terms of bit error rate (BER), it is susceptible to large error bursts caused by an inability of the iterative algorithm to converge within the allowed number of iterations. To exacerbate this situation, erroneous bits at the output to iterative detector do not necessarily cluster together. As such, it is more difficult for the error correcting code (ECC) to properly perform its function. Additionally, when utilizing LDPC errors can propagate. In other words, wrong information may be passed along the decoding process.

SUMMARY OF THE INVENTION

Therefore, it is an object of the present invention to overcome the aforementioned problems.

It is another object of the present invention to improve the accuracy in decoding data from a communication channel.

It is a further object of the present invention to minimize the propagation of errors along the decoding process.

It is still yet an object of the present invention to provide a high performance iterative detector.

It is still yet another object of the present invention to improve the accuracy in decoding data read from a magnetic recording medium.

According to this invention, a storage system is provided for storing data on a storage medium and comprises an encoder to encode data. A linear block encoder encodes data encoded by the encoder. A write circuit writes the encoded data to the storage medium, and a read circuit reads data from the storage medium. A soft channel decoder decodes data, and a soft linear block code decoder then decodes data decoded by the soft channel decoder. In the first iteration, the soft channel decoder decodes data read by the read head. In succeeding iterations, the soft channel decoder decodes the data read by the read head and utilizes information from the soft linear block decoder from an immediate preceding iteration. A threshold check circuit selects an output of the soft linear block decoder if a number of parity-check violations are less than a threshold, or an output of the soft channel decoder if a number of violations is greater than the threshold. A decoder decodes an output of the threshold check circuit.

In accordance with a second aspect of the present invention, the encoder comprises a run length limited encoder and the decoder comprises a run length limited decoder.

In accordance with a third aspect of the present invention, the linear block code encoder comprises a low-density parity-check encoder and the soft linear block code decoder comprises a low-density parity-check decoder.

In accordance with a fourth aspect of the present invention, the soft channel decoder comprises a bi-directional Viterbi algorithm decoder.

In accordance with a fifth aspect of the present invention, if there is a parity-check violation at an output of the soft linear block code decoder, the soft channel decoder decodes the output of the soft linear block code decoder.

In accordance with a sixth aspect of the present invention, if there are no parity-check violations or a number of iterations exceed a predetermined number then the threshold check circuit determines if the number of parity-check violations is less than the threshold.

In accordance with a seventh aspect of the present invention, the predetermined number is five.

In accordance with a eighth aspect of the present invention, the threshold is 12.

In accordance with a ninth aspect of the present invention, the threshold is 8.

In accordance with a tenth aspect of the present invention, the soft linear block code decoder utilizes parity-check equations to determine if there is a parity-check violation.

In accordance with an eleventh aspect of the present invention, a data transmission system for transmitting data to and receiving data from a communication channel, is provided with an encoder to encode data, and a linear block encoder to encode data encoded by the encoder. A transmitter transmits an output of the linear block encoder to the communication channel, and a soft channel decoder decodes the data. A soft linear block code decoder to decode data decoded by the soft channel decoder. In a first iteration, the soft channel decoder decodes the data from the communication channel, and in a succeeding iteration, the soft channel decoder decodes the data read by the read circuit and utilizes information decoded by the soft linear block decoder from an immediately preceding iteration. A decision circuit selects an output of the soft linear block code decoder if an evaluated criterion is less than a threshold, or an output of the soft channel decoder if the evaluated criterion is greater than the threshold. A decoder to decode an output of the threshold check circuit.

In accordance with a twelfth aspect of the present invention, the encoder comprises a run length limited encoder and the decoder comprises a run length limited decoder.

In accordance with a thirteenth aspect of the present invention, the linear block code encoder comprises a low-density parity-check encoder and wherein the soft linear block code decoder comprises a low-density parity-check decoder.

In accordance with a fourteenth aspect of the present invention, the soft channel decoder comprises a bi-directional Viterbi algorithm decoder.

In accordance with a fifteenth aspect of the present invention, if the evaluated criterion is greater than a predetermined threshold, the soft channel decoder utilizes the information of the soft linear block code decoder.

In accordance with a sixteenth aspect of the present invention, if the evaluated criterion is satisfied or a number of iterations exceeds a predetermined number then the decision circuit determines if the evaluated criterion is greater than a predetermined threshold.

In accordance with a seventeenth aspect of the present invention, the predetermined number is five.

In accordance with a eighteenth aspect of the present invention, the evaluated criterion is selected from the group consisting of signal to noise ratio, such as can be estimated through metrics in a Viterbi detector, and parity check equations.

In accordance with a nineteenth aspect of the present invention, the evaluated criterion comprises parity check equations, and wherein the soft linear block code decoder utilizes a parity-check matrix to determine if there is a parity-check violation.

In accordance with a twentieth aspect of the present invention, a multiplexer is provided in communication with the encoder and the linear block encoder and provides an output to the transmitter.

Other objects and attainments together with a fuller understanding of the invention will become apparent and appreciated by referring to the following description and claims taken in conjunction with the accompanying drawings.

BRIEF DESCRIPTION OF THE DRAWINGS

In the drawings wherein like reference symbols refer to like parts:

FIG. 2a is illustrative of the general architecture of a hard disk drive.

FIG. 2b illustrates an analog waveform of data read from the hard disk drive of FIG. 1a.

FIG. 2c illustrates a read-channel integrated circuit.

FIG. 2d illustrates a digitized waveform of the analog waveform of FIG. 1b.

DETAILED DESCRIPTION OF THE PREFERRED EMBODIMENTS

Figure 1:
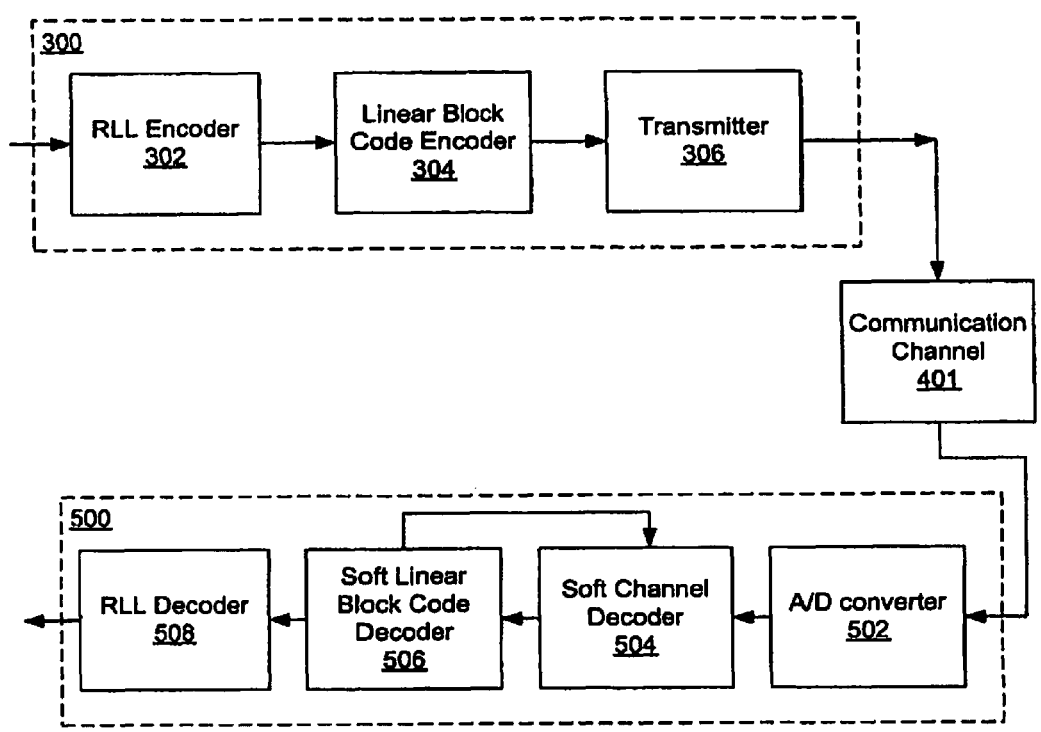
FIG. 1 is a general block diagram of a conventional digital data transmission system.
Figure 2:
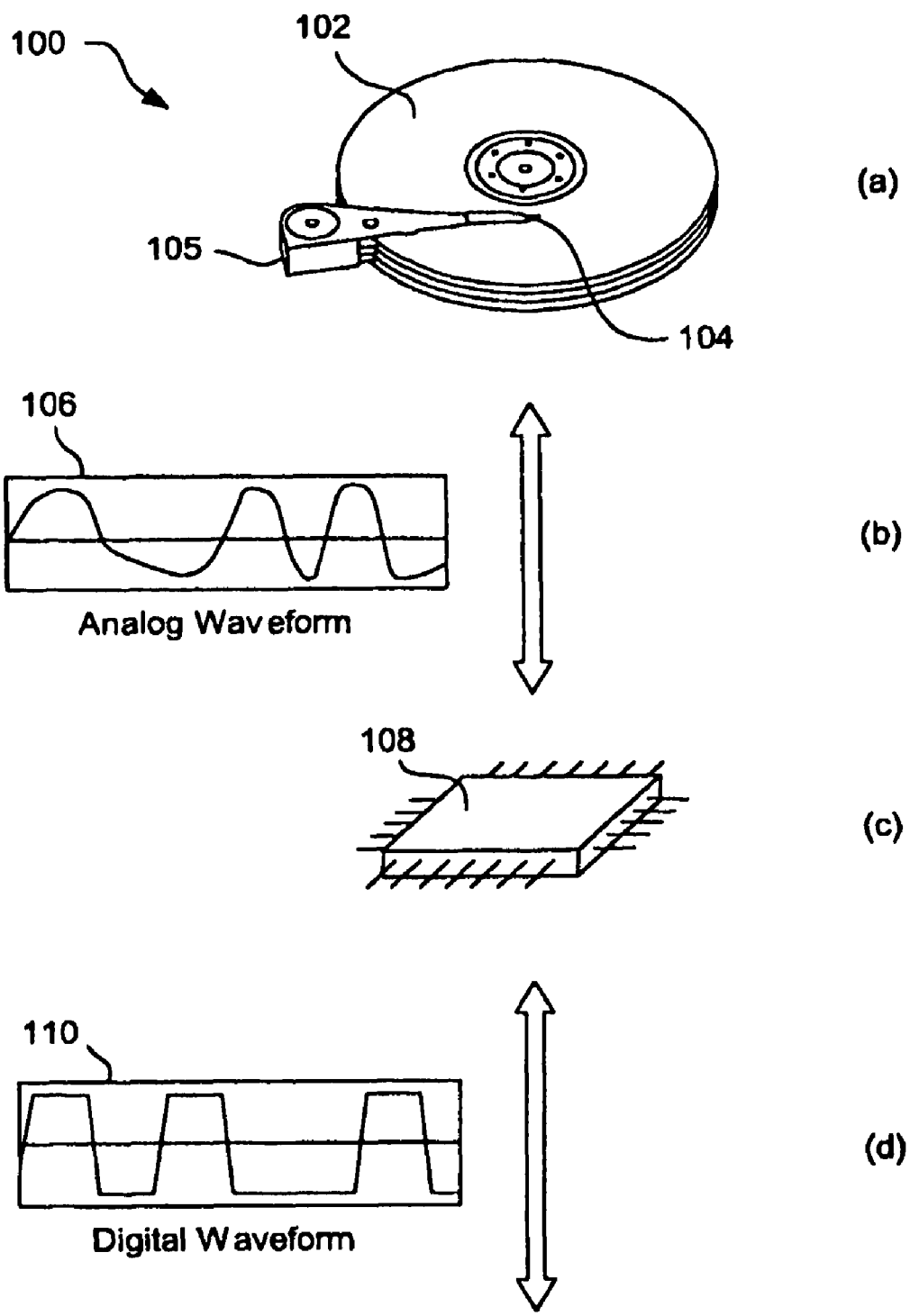
Figure 4:
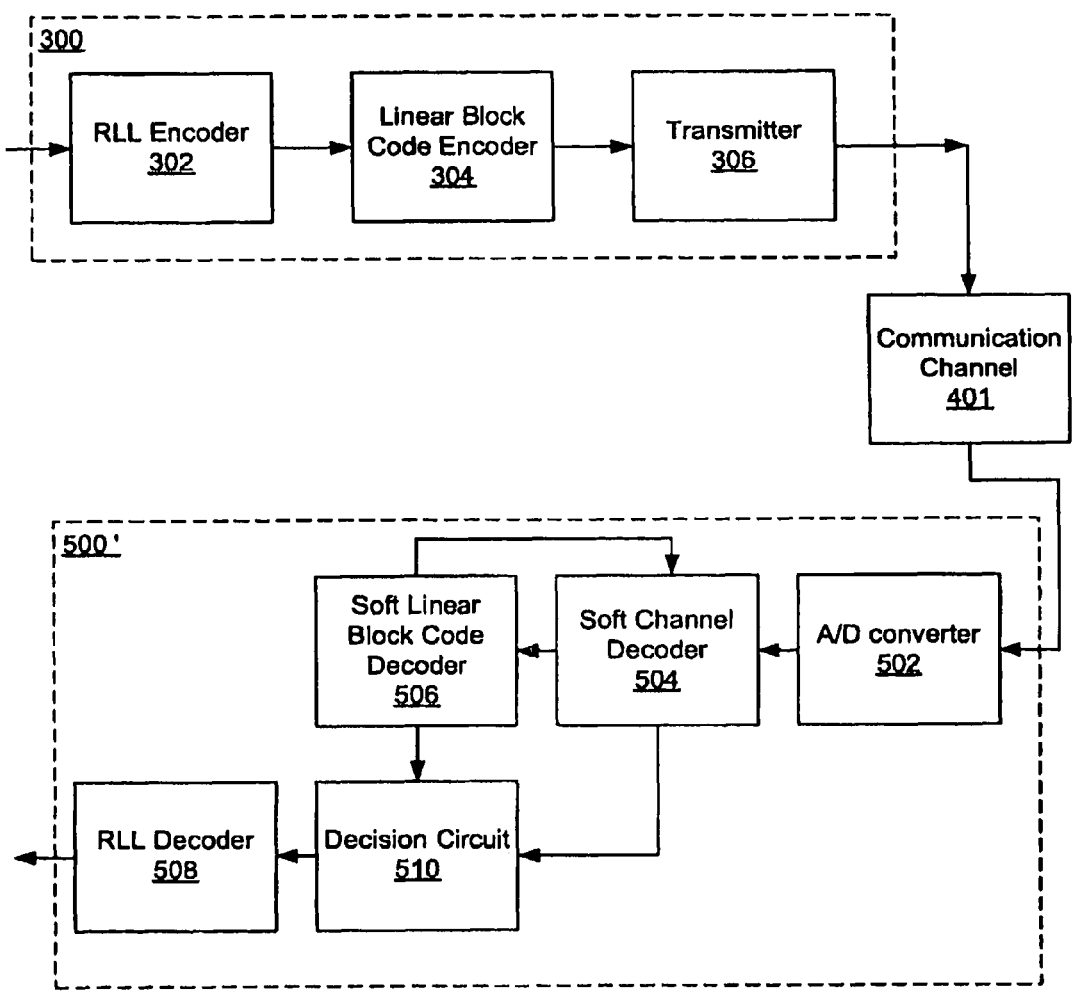
FIG. 4 is a general block diagram of a digital data transmission system in accordance with an embodiment of the present invention.

Reference is now made to FIG. 4. FIG. 4 illustrates typical flow of data signals during transmitting operations by transmitting section 300 via communication channel 401 to receiver 500' in accordance with an embodiment of the present invention. Communication channel may be implemented by any wired medium, wireless medium, optical medium and the like. Transmitting section 300 and communication channel 401 are similar to that shown in FIG. 1 and discussed above, thus no further explanation will be provided herein.

As shown in FIG. 4, receiver 500' comprises an analog to digital converter 502 to convert the analog signal from communication channel 401 into a digital signal. The digital signal is input to soft channel decoder 504 or soft channel decoding means, which provides probability information of the detected data. Soft linear block code decoder 506 or soft linear block code decoding means utilizes this estimate and the parity bits encoded in the signal to decode the detected data. Soft channel decoder 504 and soft linear block code decoder 506 operate in an iterative manner to decode the detected data.

In the first iteration (N=1), soft channel decoder 504 decodes data received from communication channel 401 which is converted to a digital signal by A/D converter 502. In succeeding iterations (N>1), soft channel decoder 504 decodes the data from communication channel 401 and utilizes information from soft linear block decoder 506 from an immediate preceding iteration (N−1).

The output of soft linear block code decoder 506 and the output of soft channel decoder 504 are evaluated in decision circuit 510 or decision means to determine select an output whether soft linear block code decoder 506 if an evaluated criterion have been met. Such criterion can include a comparison of the signal to noise ratio to a threshold value, such as can be estimated through metrics in a Viterbi detector, a comparison of the parity check equations and the like. The Viterbi detector is well know to those of ordinary skill in the art and no further discussion will be presented herein. As will be appreciated by one or ordinary skill in the art, any combination of the above-mentioned criteria my be utilized by decision circuit 510. Additionally, the decision circuit may be implemented employing weighting factors for each of such criteria.

The output of soft channel decoder 504 (corresponding to the first iteration) is selected if the evaluated criterion at the end of the last iteration is greater than the threshold. On the other hand, if the evaluated criterion is less than the threshold then the output of soft linear block code decoder 506 is selected. The output of decision circuit 510 is RLL decoded by RLL decoder 508 or RLL decoding means.

Figure 5:
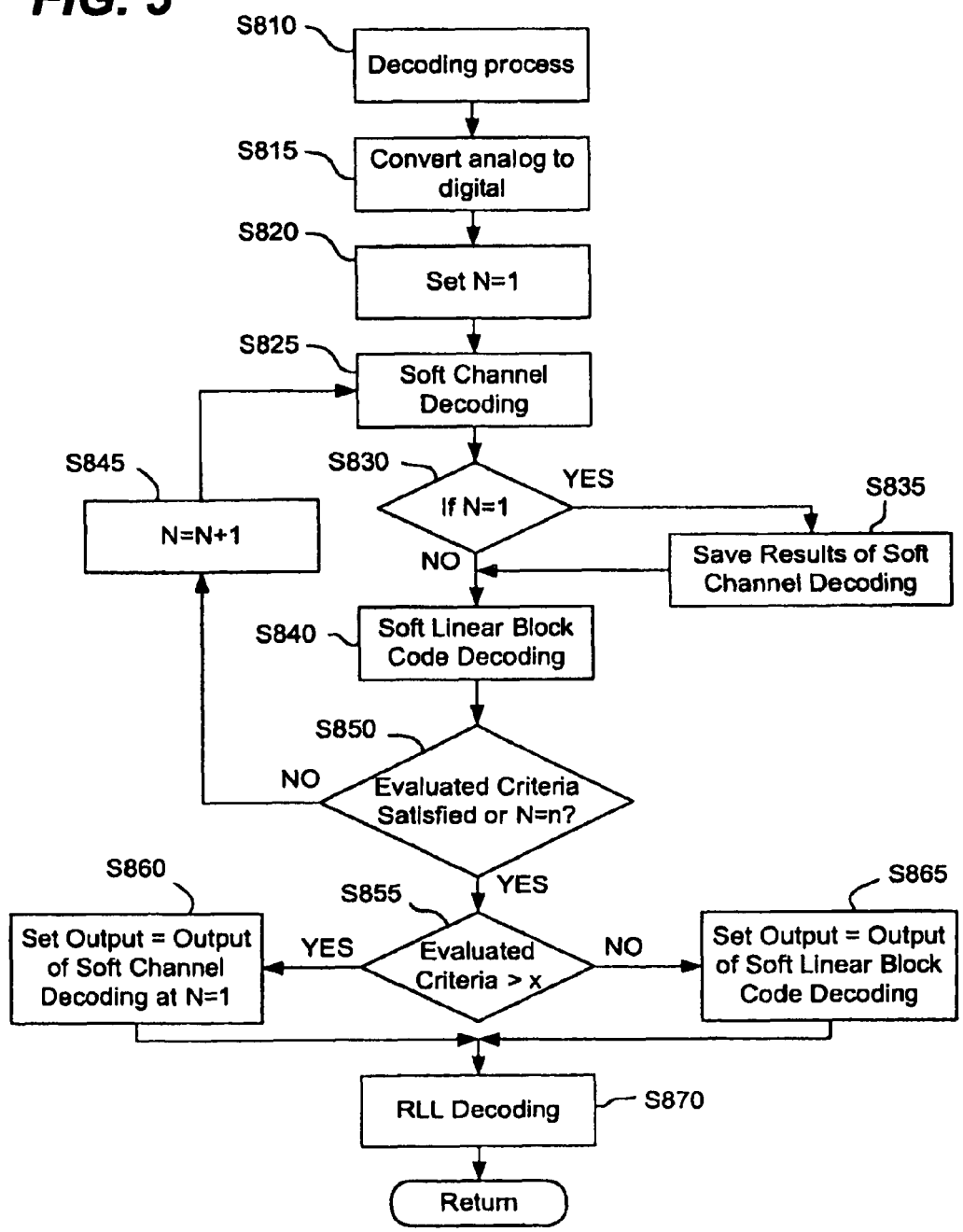
FIG. 5 is a flow chart of the process incorporated of the embodiment of FIG. 4.

FIG. 5 is a flowchart illustrating the operation of the receiver in FIG. 4. As noted above, the output of communication channel 401, which is an analog signal, is converted to a digital signal in step S815 by analog to digital decoder 502. The counter N is set to 1 in step S820. The digital signal is then soft channel decoded by soft channel decoder 504 in step S825. After the first soft channel decoding process the results are saved in a buffer memory, otherwise the results thereof are not saved (steps S830 and S840).

The results of the soft channel decoder 504 are then soft linear decoded by soft linear block code decoder 506, step S840. In step S850, decision circuit 510 determines if the evaluated criterion is satisfied. If the evaluated criterion is satisfied or if the number of iterations N is equal to n, then processing continues to step S855; otherwise N is incremented by 1 and the next iteration of processing is performed.

In step S855 decision circuit 510 determines if the evaluated criterion is greater than a predetermined threshold x. If the evaluated criterion is greater than x, then the output is set to the output of the soft channel decoder at N=1, which was previously saved in step S835. Alternatively, if the evaluated criterion is not greater than x, the output is set to the output of the soft linear block code decoding, step S865. The output is then RLL decoded in step S870.

Figure 3:
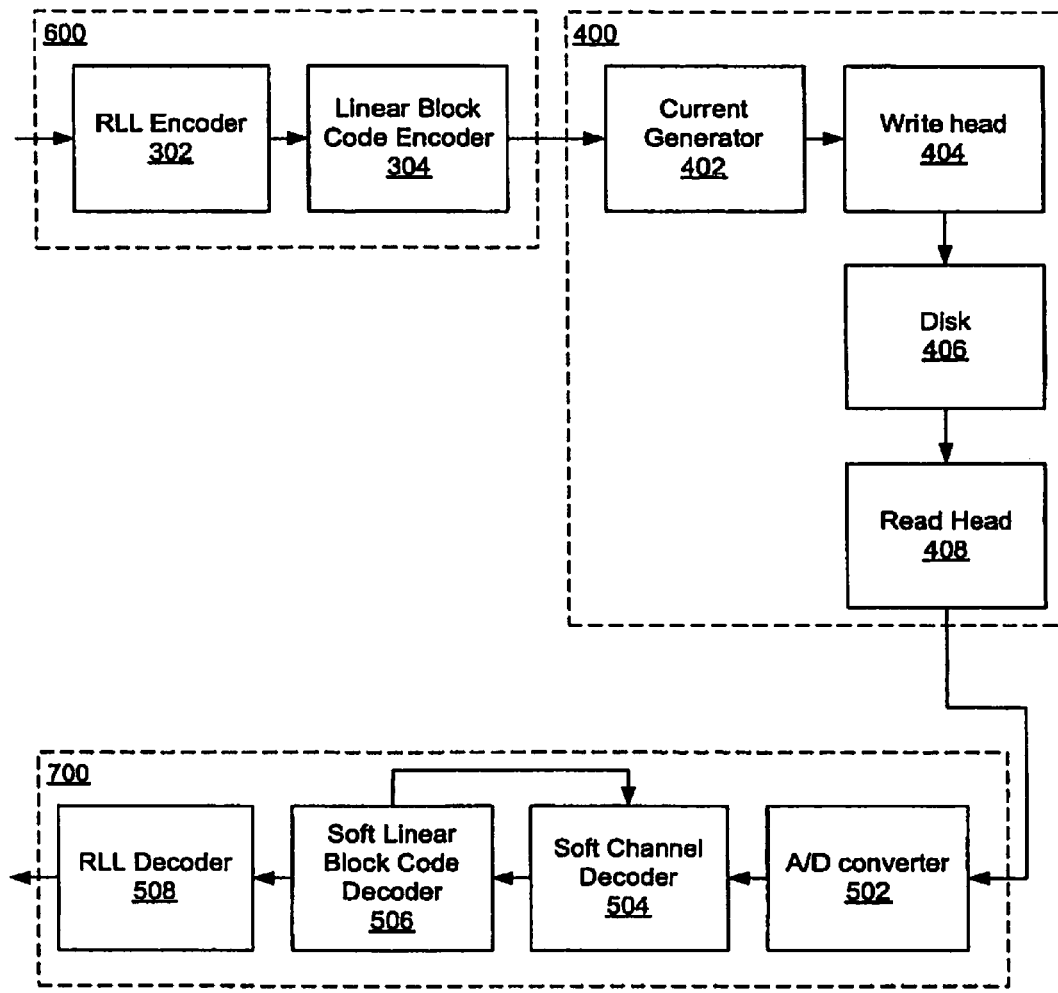
FIG. 3 is a block diagram of an encoder, hard disk drive and read channel having a conventional iterative decoder.
Figure 6:
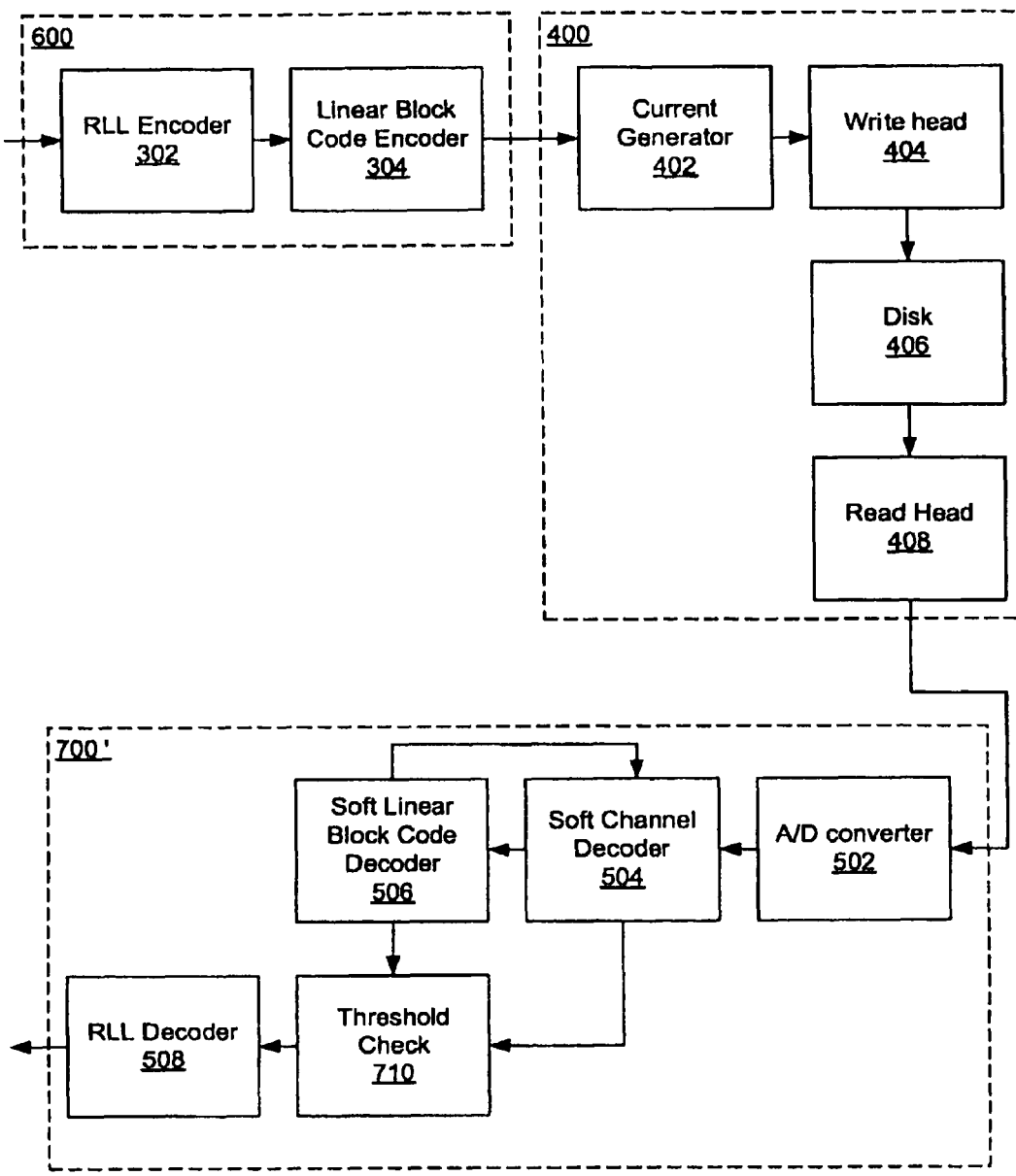
FIG. 6 is a block diagram of an encoder, hard disk drive and read channel having an iterative decoder in accordance with an embodiment of the present invention.

FIG. 6 illustrates the embodiment of the present invention when employed with a mass storage system. As will be appreciated by one of ordinary skill in the art, a mass storage system is just one specific example of a data transmission system. FIG. 6 illustrates typical flow of data signals during write operations by encoder 600 onto disk drive 400 and read operations by read channel 700' from disk drive 400. Encoder 600 and disk drive 400 are similar to that shown in FIG. 3 and discussed above, thus no further explanation will be provided herein.

As shown in FIG. 6, read channel 700' comprises an analog to digital converter 502 to convert the analog signal from read head 408 into a digital signal. The digital signal is input to soft channel decoder 504 or soft channel decoding means, which provides probability information of the detected data. Soft linear block code decoder 506 or soft linear block code decoding means utilizes this estimate and the parity bits encoded in the signal to decode the detected data. Soft channel decoder 504 and soft linear block code decoder 506 operate in an iterative manner to decode the detected data.

In the first iteration (N=1), soft channel decoder 504 decodes data read by read head 408 which is converted to a digital signal by A/D converter 502. In succeeding iterations (N>1), soft channel decoder decodes 504 the data read by the read head and utilizes information from soft linear block decoder 506 from an immediate preceding iteration (N−1).

The output of soft linear block code decoder 506 and the output of soft channel decoder 504 are evaluated in threshold check 710 or threshold determining means to determine whether soft linear block code decoder 506 has a number of parity check equation violations which exceed a threshold. The output of soft channel decoder 504 (corresponding to the first iteration) is selected if the number of parity check equations violated at the end of the last iteration is greater than the threshold. On the other hand, if the number of violations is less than the threshold then the output of soft linear block code decoder 506 is selected. The output of threshold check 710 is RLL decoded by RLL decoder 508 or RLL decoding means.

Figure 8:
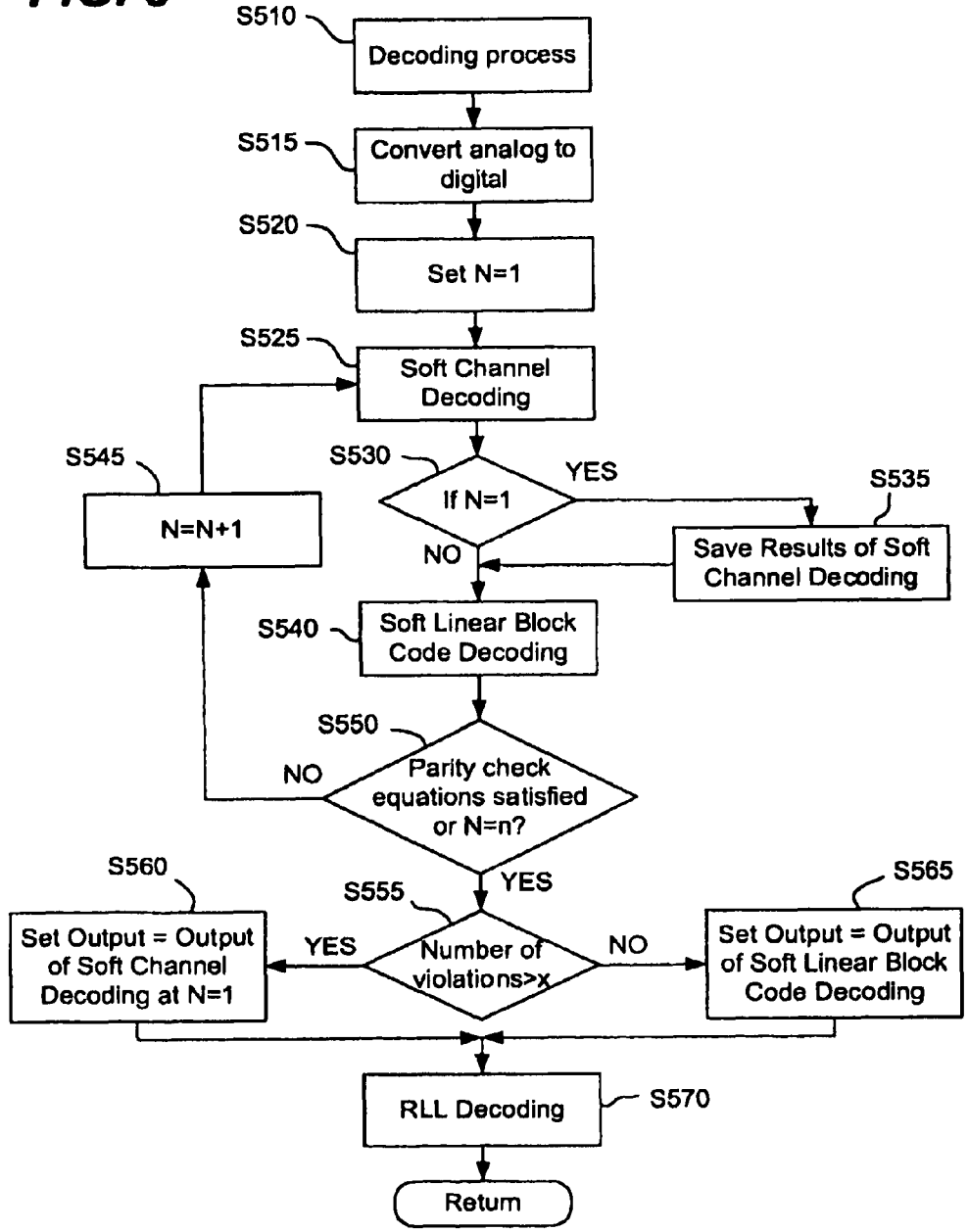
FIG. 8 is a flow chart of the process incorporated of the embodiment of FIG. 6.

FIG. 8 is a flowchart illustrating the operation of the read channel in FIG. 6. As noted above, the output of read head 408, which is an analog signal, is converted to a digital signal in step S515 by analog to digital decoder 502. The counter N is set to 1 in step S520. The digital signal is then soft channel decoded by soft channel decoder 504 in step S525. Examples of soft channel decoding include the bi-directional Viterbi algorithm (BIVA) and the Bahl-Cooke-Jelinek-Raviv (BCJR) algorithm. These algorithms are discussed by Zining Wu in *Coding and Iterative Detection For Magnetic Recording Channels,* 2000, Kluwer Academic Publishers. The bi-directional Viterbi algorithm is discussed by Shoemake and Heegard in *Computationally Efficient Turbo Decoding with Bi-directional Viterbi Algorithm (BIVA)*, IEEE, ISIT 1997, the contents of which are incorporated herein by reference. After the first soft channel decoding process the results are saved in a buffer memory, otherwise the results thereof are not saved (steps S530 and S540).

The results of the soft channel decoder 504 are then soft linear decoded by soft linear block code decoder 506, step S540. An example of linear block decoding is low-density parity check code (LDPC) decoding. As noted above LDPC is discussed by Robert G. Gallager in *Low-Density Parity-Check Codes,* 1963, M.I.T. Press and by Zining Wu in *Coding and Iterative Detection For Magnetic Recording Channels,* 2000, Kluwer Academic Publishers.

In step S550, the parity check equations are calculated to determine if there are any violations. If there are no violations or if the number of iterations N is equal to n, then processing continues to step S555; otherwise N is incremented by 1 and the next iteration of processing is performed.

In step S555 threshold detector 510 determines if the number of violations is greater than x. If the number of violations is greater than x, then the output is set to the output of the soft channel decoder at N=1, which was previously saved in step S535. Alternatively, if the number of violations is not greater than x, the output is set to the output of the soft linear block code decoding, step S565. The output is then RLL decoded in step S570.

An example of the parity check matrix having three parity equations (represented by the parity check matrix) and 7 bits (represented by the 7 element vector) is set forth in equation (1) below. In practice the number of parity equations is between 60 and 120 and the number of bits is between 1100 and 1300.

$$\begin{bmatrix} 1001011 \\ 0100111 \\ 0011101 \end{bmatrix} \times \begin{bmatrix} x1 \\ x2 \\ x3 \\ x4 \\ x5 \\ x6 \\ x7 \end{bmatrix} = \begin{bmatrix} 0 \\ 0 \\ 0 \end{bmatrix} modulo\ 2 \quad (1)$$

Alternatively, the parity equations may be expressed as equations (2).

$x_1 + x_4 + x_6 + x_7 = 0$ modulo 2

$x_2 + x_5 + x_6 + x_7 = 0$ modulo 2

$x_3 + x_4 + x_5 + x_7 = 0$ modulo 2 (2)

When equation (1) is (or equations (2) are) satisfied, there are no parity violations and the data is valid. When equation (1) is (or any of equations (2) are) not satisfied the data is not valid.

An example of a parity check matrix equation with one violation is shown in equations (3)

$x_1 + x_4 + x_6 + x_7 = 0$ modulo 2

$x_2 + x_5 + x_6 + x_7 = 1$ modulo 2

$x_3 + x_4 + x_5 + x_7 = 0$ modulo 2 (3)

In step S550 if the number of violations is 0 or the number of iterations N=n, then processing proceeds to step to step S555. In step S555, the number of equations, which are violated, is determined. Processing then proceeds to step S570 as explained above.

Best Mode

Figure 7:
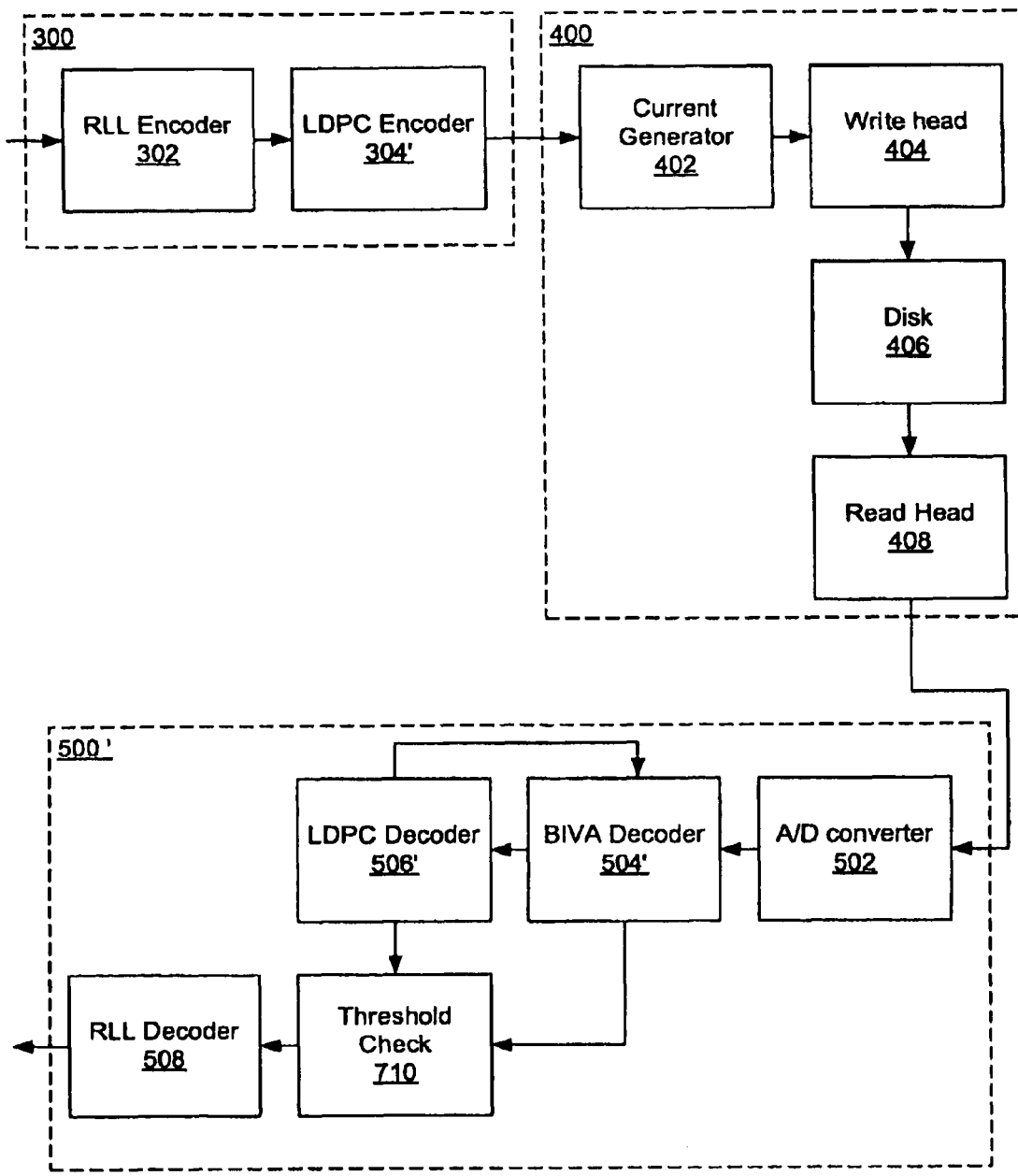
FIG. 7 is a block diagram of an encoder, hard disk drive and read channel having an iterative decoder in accordance with a preferred embodiment of the present invention.
Figure 9:
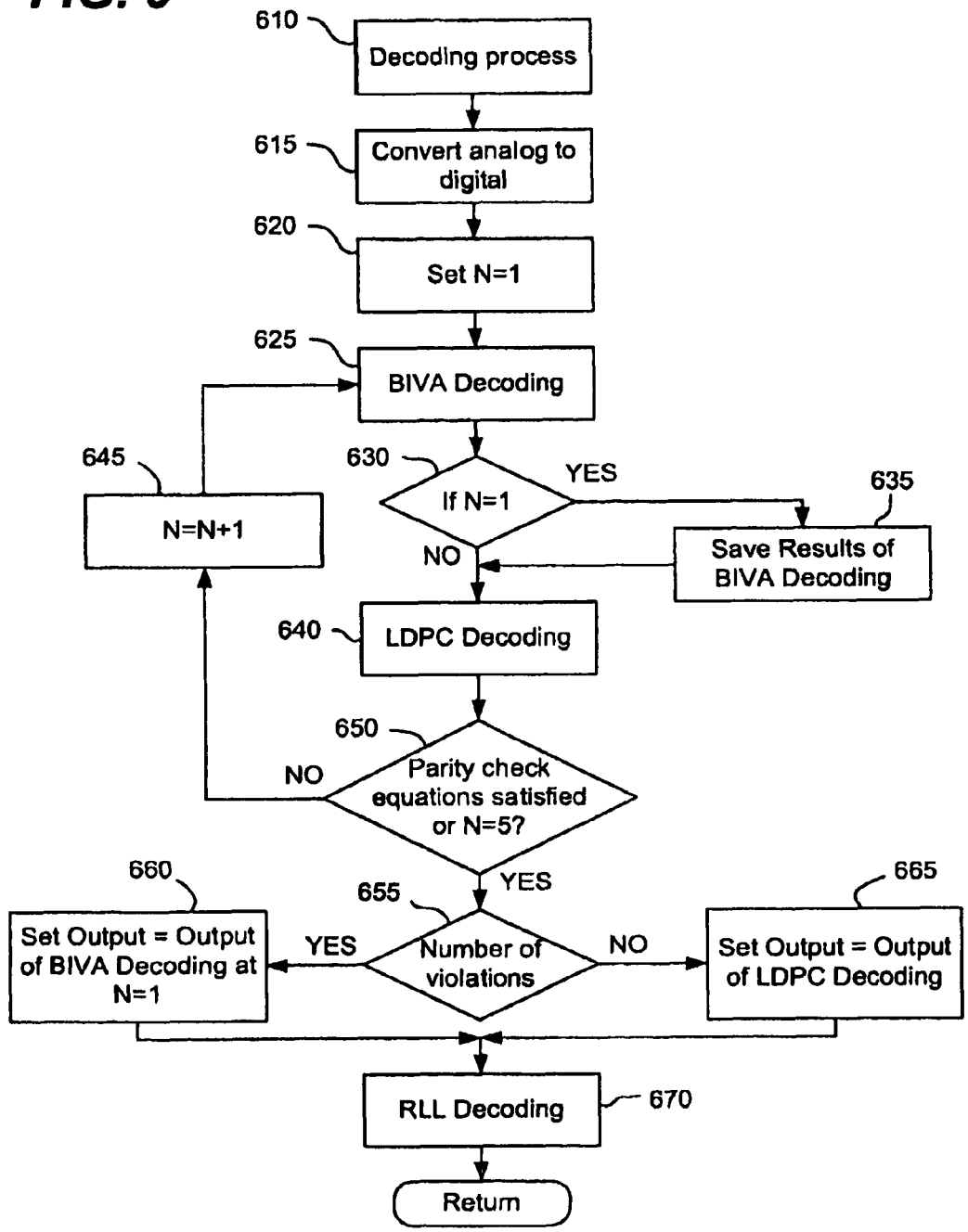
FIG. 9 is a flow chart of the process incorporated of the embodiment of FIG. 7.

FIG. 7 and FIG. 9 show the best mode of the preferred embodiment. Read channel 700' is preferably fabricated as an integrated circuit. As shown therein, linear block code encoder is implemented as a LDPC encoder 304', soft channel decoder is implemented as a bi-direction Viterbi algorithm (BIVA) decoder 504' or BIVA decoding means, and soft linear block code decoder is implemented as an LDPC decoder 506' or LDPC decoding means. LDPC decoder 506' employs the "sum product" method. In the best mode of the preferred embodiment, the number of iterations in step S650 n is 5. Preferably, the number of bits is either 1210 or 1173 and the number of parity check equations is 105 or 68, respectively. If the number of parity equations is 105, the threshold in step S655, x is 12, or if the number of parity equations is 68 then x is 8.

FIG. 9 is a flowchart illustrating the operation of the read channel in FIG. 7. As noted above, the output of read head 408, which is an analog signal, is converted to a digital signal in step S615 by analog to digital decoder 502. The counter N is set to 1 in step S620. The digital signal is then decoded using the bi-directional Viterbi algorithm (BIVA) by BIVA decoder 504' in step S625. After the first BIVA decoding process the results are saved in a buffer memory, otherwise the results thereof are not saved (steps S630 and S640).

The results of the BIVA decoder 504' are then LDPC decoded by LDPC decoder 506' or LDPC decoding means, step S640. In step S650, the parity check equations are calculated to determine if there are any violations. If there are no violations or if the number of iterations N is equal to 5, then processing continues to step S655; otherwise N is incremented by 1 and the next iteration of processing is performed.

In step S655 threshold detector 510 determines if the number of violations is greater than x. For the case where there are 1210 bits of data are processed in a time period, there are 105 parity check equations. As will be understood by one of ordinary skill in the art, the matrix is sized 1210×105. For this case, if the number of violations is greater than 12, then the output is set to the output of the BIVA decoder 504' at N=1, which was previously saved in step S635. Alternatively, if the number of violations is not greater than 12, the output is set to the output of the LDPC decoding, step S665. Similarly for the case where 1173 bits are processed in a time period, there are 68 parity check equations which corresponds to an 1173×68 matrix. With this size matrix, if the number of violations is greater than 8 then the output is set to the output of the BIVA decoder 504' at N=1, which was previously saved in step S635. In either case, the output is then RLL decoded in step S670.

Figure 6A:
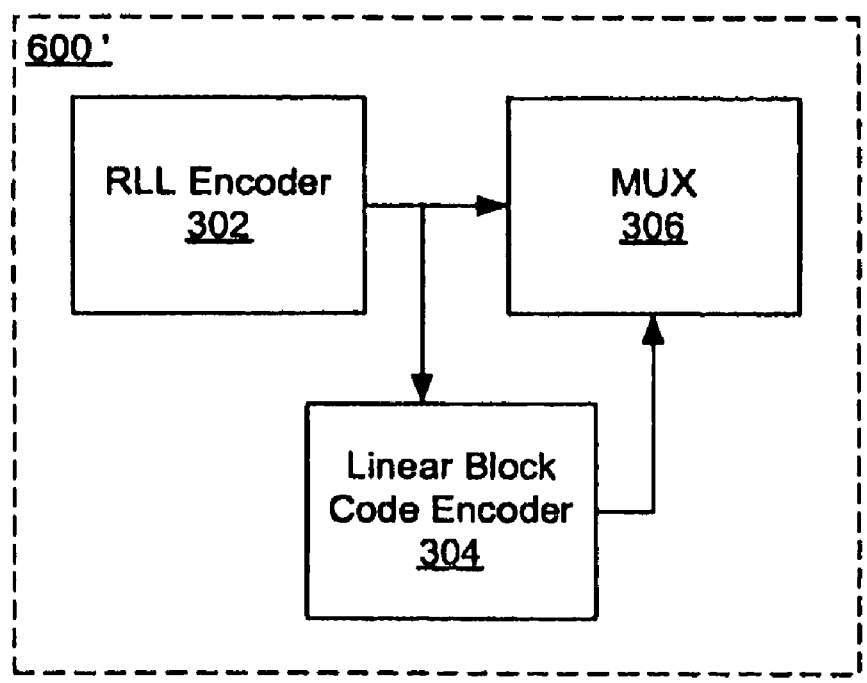
FIG. 6A is a block diagram of another encoder in accordance with an embodiment of the present invention.

FIG. 6A shows an alternate encoder 600' in accordance with a preferred embodiment of the present invention. As shown therein, the input signal is RLL encoded by RLL encoder 302 which is then linear block code encoded by linear block code encoder 304 to generate parity data. The outputs of both the RLL encoder 302 and linear block code encoder 304 are then combined by multiplexer 306 or multiplexing means.

While the invention has been described in conjunction with several specific embodiments, it is evident to those skilled in the art that many further alternatives, modifications and variations will be apparent in light of the foregoing description. More specifically, while the read channel of the present invention is implemented as an integrated circuit, it is contemplated that the present invention may also be implemented as discrete components or a general-purpose processor operated in accordance with program code instructions or computer program or combination thereof. These program code instructions can be obtain from a medium, such as network, local area network, the Internet, or storage devices. Such storage devices include, by way of example, magnetic storage devices, optical storage devices, electronic storage devices, magneto-optical device and the like. Moreover, as will be appreciated by one of ordinary skill in the art, while a number of examples have shown being utilized with mass storage systems, the same encoder and decoder circuits and methods may also be utilized with data transmission systems. As such, apparatuses and techniques discussed with the preferred embodiments are just as applicable with data transmissions systems. Thus, the invention described herein is intended to embrace all such alternatives, modifications, applications and variations as may fall within the spirit and scope of the appended claims.

What is claimed is:

1. A storage system comprising:
   a linear block encoder configured to encode data to generate encoded data;
   a write circuit configured to write the encoded data to a storage medium;
   a read circuit configured to read the encoded data from the storage medium;

a channel decoder configured to, during a first decoding iteration, decode the encoded data to generate first decoded data;
a soft linear block code decoder configured to, during the first decoding iteration, decode the first decoded data to generate second decoded data,
wherein during a second decoding iteration, the channel decoder is configured to decode the encoded data i) subsequent to the soft linear block code decoder decoding the first decoded data and ii) based on the second decoded data; and
a threshold check circuit configured to select:
    a first output of the soft linear block code decoder if a number of parity check violations has a first relationship with respect to a threshold, or
    a second output of the channel decoder if the number of parity check violations has a second relationship with respect to the threshold,
    wherein if the first output includes a parity-check violation, the threshold check circuit is configured to select, based on the second decoded data, one of the first output and the second output.

2. The storage system of claim 1, wherein:
the linear block encoder comprises a low-density parity-check encoder; and
the soft linear block code decoder comprises a low-density parity check decoder.

3. The storage system of claim h wherein the channel decoder comprises a Viterbi decoder.

4. A storage system comprising:
a linear block encoder configured to encode data to generate encoded data;
a write circuit configured to write the encoded data to a storage medium;
a read circuit configured to read the encoded data from the storage medium;
a channel decoder configured to, during a first decoding iteration, decode the encoded data to generate first decoded data
a soft linear block code decoder configured to, during the first decoding iteration, decode the first decoded data to generate second decoded data
wherein during a second decoding iteration, the channel decoder is configured to decode the encoded data i) subsequent to the soft linear block code decoder decoding the first decoded data and ii) based on the second decoded data; and
a threshold check circuit configured to select:
    an output of the soft linear block code decoder if a number of parity check violations has a first relationship with respect to a threshold, or
    an output of the channel decoder if the number of the parity check violations has a second relationship with respect to the threshold,
    wherein if there are no parity-check violations or a number of decoding iterations performed by the channel decoder and the soft linear block code decoder exceeds a predetermined number, the threshold check circuit is configured to determine if the number of the parity-check violations has the first relationship with respect to the threshold.

5. The storage system of claim 4, wherein the predetermined number is equal to 5.

6. The storage system of claim 1, wherein the threshold is equal to 12.

7. The storage system of claim 1, wherein the threshold is equal to 8.

8. A storage system comprising:
a linear block encoder configured to encode data to generate encoded data;
a write circuit configured to write the encoded data to a storage medium;
a read circuit configured to read the encoded data from the storage medium;
a channel decoder configured to, during a first decoding iteration, decode the encoded data to generate first decoded data;
a soft linear block code decoder configured to, during the first decoding iteration, decode the first decoded data to generate second decoded data,
wherein during a second decoding iteration, the channel decoder is configured to decode the encoded data i) subsequent to the soft linear block code decoder decoding the first decoded data and ii) based on the second decoded data; and
a threshold check circuit configured to select:
    an output of the soft linear block code decoder if a number of parity check violations has a first relationship with respect to a threshold, or
    an output of the channel decoder if the number of the parity check violations has a second relationship with respect to the threshold,
wherein the soft linear block code decoder is configured to determine if there is a parity-check violation based on a parity-check matrix.

9. The storage system of claim 1, further comprising:
a multiplexer in communication with an encoder and the linear block encoder, wherein the multiplexer is configured to transmit an output to the write circuit.

10. A method comprising:
linear block encoding data to generate encoded data;
writing the encoded data to a storage medium;
reading the encoded data from the storage medium;
during a first decoding iteration, channel decoding the encoded data read from the storage medium to generate first decoded data;
during the first decoding iteration, soft linear block code decoding the first decoded data to generate second decoded data,
wherein during a second decoding iteration, the channel decoding of the encoded data is performed based on the second decoded data;
calculating a number of parity-check violations based on the soft linear block code decoding of the first decoded data; and
selecting
    the first decoded data if the number of the parity-check violations has a first relationship with respect to a threshold, or
    the second decoded data if the number of the parity check violations has a second relationship with respect to the threshold,
wherein channel decoding the encoded data is based on the second decoded data if number of the parity-check violations is greater than or equal to 1.

11. The method of claim 10, wherein:
the linear block encoding of the data comprises low-density parity-check encoding; and
the soft linear block code decoding of the first decoded data comprises low-density parity-check decoding.

12. The method of claim 10, wherein channel decoding the encoded data comprises Viterbi decoding.

13. The method of claim 10, further comprising:
  determining a number of iterations that the channel decoding of the encoded data and the soft linear block code decoding of the first decoded data is performed; and
  determining if the number of the parity-check violations has the first relationship with respect to the threshold if, there are no parity-check violations or the number of iterations determined exceeds a predetermined number.

14. The method of claim 13, wherein the predetermined number is equal to five.

15. The method of claim 10, wherein the threshold is equal to 34.

16. The method of claim 10, wherein the threshold is equal to 8.

17. The method of claim 10, wherein the calculating of the number of the parity-check violations comprises determining if there is a parity-check violation based on a parity-check matrix.

* * * * *